(12) United States Patent
Degnan, III et al.

(10) Patent No.: US 8,144,312 B2
(45) Date of Patent: Mar. 27, 2012

(54) TELESCOPE WITH A WIDE FIELD OF VIEW INTERNAL OPTICAL SCANNER

(75) Inventors: John James Degnan, III, Annapolis, MD (US); Yunhui Zheng, Crofton, MD (US)

(73) Assignee: Sigma Space Corporation, Lanham, MD (US)

( * ) Notice: Subject to any disclaimer, the term of this patent is extended or adjusted under 35 U.S.C. 154(b) by 345 days.

(21) Appl. No.: 12/547,237

(22) Filed: Aug. 25, 2009

(65) Prior Publication Data

US 2011/0051121 A1    Mar. 3, 2011

(51) Int. Cl.
*G01C 3/08* (2006.01)
*G02B 26/08* (2006.01)
*H01J 3/14* (2006.01)

(52) U.S. Cl. ............ 356/5.05; 359/201.1; 250/236
(58) Field of Classification Search ............ 356/5.05; 359/201.1; 250/236
See application file for complete search history.

(56) References Cited

U.S. PATENT DOCUMENTS

| | | | | |
|---|---|---|---|---|
| 4,355,904 A | * | 10/1982 | Balasubramanian | 356/608 |
| 4,414,684 A | * | 11/1983 | Blonder | 382/127 |
| 4,850,686 A | * | 7/1989 | Morimoto et al. | 359/196.1 |
| 5,272,325 A | * | 12/1993 | Peng | 235/462.35 |
| 5,835,252 A | * | 11/1998 | Meier et al. | 359/201.1 |
| 5,949,531 A | * | 9/1999 | Ehbets et al. | 356/5.01 |
| 7,248,342 B1 | * | 7/2007 | Degnan | 356/5.01 |
| 2002/0060784 A1 | * | 5/2002 | Pack et al. | 356/6 |
| 2007/0279615 A1 | * | 12/2007 | Degnan et al. | 356/4.01 |

OTHER PUBLICATIONS

Degan J. J., A Conceptual Design for a Spaceborne 3D Imaging Lidar, e&i heft 4, 119.Jahrgang, Apr. 4, 2002.*
Degan J. J., Second-Generation Scanning 3D Imaging Lidar Based on Photon-Counting, Sigma Space Corporation, 2003.*

* cited by examiner

*Primary Examiner* — Thomas Tarcza
*Assistant Examiner* — Antoine J Bedard
(74) *Attorney, Agent, or Firm* — Miodrag Cekic; Intellectual Property Strategists, LLC

(57) ABSTRACT

A telescope with internal scanner utilizing either a single optical wedge scanner or a dual optical wedge scanner and a controller arranged to control a synchronous rotation of the first and/or second optical wedges, the wedges constructed and arranged to scan light redirected by topological surfaces and/or volumetric scatterers. The telescope with internal scanner further incorporates a first converging optical element that receives the redirected light and transmits the redirected light to the scanner, and a second converging optical element within the light path between the first optical element and the scanner arranged to reduce an area of impact on the scanner of the beam collected by the first optical element.

46 Claims, 8 Drawing Sheets

TELESCOPE WITH A WIDE FIELD OF VIEW INTERNAL OPTICAL SCANNER

STATEMENT REGARDING FEDERALLY SPONSORED RESEARCH AND DEVELOPMENT

This invention was conceived using US Government funding under NASA Contract No. NHH05CC68C entitled "A Scanning Active Laser Altimeter/Polarimeter and Passive Hyperspectral Imager for Globally Contiguous, High Resolution Mapping of the Jovian Moons". The US government has certain rights in this invention.

BACKGROUND OF THE INVENTION

The invention relates generally to the integration of scanning optical sensors with telescopes. In particular, the invention relates to telescopes with wide field of view internal optical scanners. In particular embodiments, the telescope with internal scanner may be part of an active imaging LIDAR system or passive optical sensor for use onboard an aircraft or spacecraft.

In one embodiment, a telescope with an internal optical scanner permits high speed scanning over a wide angular field of view (several degrees) while simultaneously providing a narrow instantaneous field of view for background noise suppression, contiguous topographic coverage, and high spatial resolution. In embodiments intended for use onboard an aircraft or spacecraft as part of an imaging LIDAR system for three-dimensional and polarization imaging of topographic surfaces and volumetric scatterers, the telescope with internal scanner in accordance to the present invention may allow for maintaining a narrow instantaneous Field Of View (FOV) for background noise rejection and may also enable transmitter point-ahead compensation at high orbital altitudes or scanning speeds.

When compared to an external scanning device which must match or exceed the aperture of the primary receive telescope in size, the use of an internal optical scanner significantly reduces the mass, size, and prime power consumption of the optical scanning system since the aperture is reduced approximately proportionally to the magnification of the telescope. In addition, high scan rate capabilities (~600 RPM or higher), relatively wide angular FOV (on the order of ten degrees), low or vanishing total angular momentum, and ability to compensate for transmitter point-ahead may provide additional benefits.

In embodiments intended for airborne or spaceborne applications, large telescope light collecting apertures are often required in order to boost signals to a detectable level either due to high aircraft or spacecraft altitudes or, in the case of passive sensors, when the surface of interest is located far from the spacecraft or the Sun, as in Deep Space missions. Thus, many Earth, Lunar and Deep Space science missions attempting to achieve globally contiguous, high resolution, coverage of a planetary or lunar surface may benefit from this innovation. Sensors benefiting from this innovation include both active LIDARs and passive optical sensors (e.g. cameras, multispectral and/or hyperspectral imagers).

Conventional spaceborne laser altimeters typically use modest energy (50 to 100 milliJoules) solid-state laser, large telescopes having apertures of 50 to 200 centimeters in diameter, and high detection thresholds to achieve unambiguous surface returns with few or no false alarms resulting from solar background noise. As a result of this conventional design philosophy, spacecraft prime power and weight constraints typically restrict operations to modest repetition rates on the order of a few tens of Hz which, for a typical earth orbit ground velocity of seven kilometers per second, limits along-track spatial sampling to one sample every few hundred meters. There is a recognized need to obtain higher along-track resolution and/or better cross-track coverage, but achieving this capability through a simple scaling of the laser fire rate or power is not practical from spacecraft. This is especially true of altimeters for use in orbit about other planets where instrument mass, volume, and prime power usage is severely restricted. Furthermore, the conventional high signal-to-noise ratio approach to laser altimetry does not make efficient use of the available laser photons.

First generation altimetric approaches are not well suited to generating the few meter level horizontal resolution and decimeter precision vertical (range) resolution on the global scale desired by many in the Earth and planetary science communities. The first generation spaceborne altimeters are characterized by a laser operating in the infrared (1064 nm) at a few tens of Hz with moderate output energies (50 to 100 mJ), a telescope in the 50 to 100 cm range, and a single element (i.e. non-pixellated) detector that detects and processes multi-photon returns from the surface. On bare terrain, the signal waveforms reflect the slope and surface roughness within the laser footprint (typically several tens of meters in diameter) as well as any false slopes due to pointing error. On Earth, the presence of manmade buildings and volumetric scatterers (such as tree canopies or other vegetation) generally makes waveform interpretation even more complex and difficult.

One challenge to the conventional approach is the sheer number of measurements required over a nominal mission lifetime of two to three years. For example, in order to generate a 5 m×5 m vertical grid map of Mars, which has a mean volumetric radius of 3390 km, over 7 trillion individual range measurements are required, assuming that no ground spatial element is measured twice. In any realistic mission, the actual number of range measurements will be significantly larger since an instrument designed to provide contiguous coverage at the planetary equator would oversample the higher latitudes where the ground tracks are more narrowly spaced. If one were to simply scale conventional approaches, one would clearly face severe prime power, weight, and instrument longevity issues.

A second technical challenge is the high ground speed of the spacecraft (about 3 km/sec for a nominal 300 km altitude Mars orbit) coupled with the need to incorporate a scanner to cover the large area between adjacent ground tracks, especially near the equator. At a nominal altitude of 300 km, for example, the satellite would have an orbital period about Mars of approximately 113 minutes. Thus, a three-year mission would produce 13,910 orbits or 27,820 equator crossings with an average spacing between ground tracks at the equator of 766 meters. The latter spacing corresponds to about 154 resolution elements (~5 m) in the cross-track direction between adjacent ground tracks and further implies a minimum cross-track scan angle of about 0.15 degrees. For truly contiguous coverage using a conventional single element detector, these 154 cross-track measurements should be completed in the time it takes the spacecraft to move one resolution element in the along-track direction, or within 1.67 msec. This implies a laser fire rate of 92.4 kHz. Furthermore, a uniformly rotating mechanical scanner, for example, should complete a half cycle of its movement within the same 1.67 msec period, i.e. 300 Hz (18,000 RPM). While alternative non-mechanical scanners, such as electrooptic or acousto-optic devices, are capable of very high scanning speeds and have no moving parts, they typically fall far short of the angular range requirements, are highly limited in their useful aperture, and/or require fast high voltage or high RF power drivers.

An additional technical challenge stems from the high laser fire rate and the long pulse time of flight (TOF). At 300 km altitude, the laser pulse completes a roundtrip transit to the surface in 2 msec. Thus, for laser fire rates in excess of 500 Hz, multiple pulses will be in flight simultaneously. In principle, it is possible to associate the correct return pulse with the appropriate outgoing pulse provided the roundtrip satellite-to-surface TOF is known beforehand to well within a single laser fire interval. For the 92.4 kHz rate derived previously, however, approximately 185 pulses would be simultaneously in transit, and it would be necessary to have knowledge of the orbit at the 1.6 km level in order to tie a given surface return to the appropriate output pulse unambiguously. While such a navigation accuracy might be easy to achieve in Earth orbit using either Global Positioning System (GPS) receivers or Satellite Laser Ranging (SLR) to passive reflectors on the spacecraft, it would likely be a much more difficult challenge in orbits about extraterrestrial bodies.

An additional technical problem associated with the longer pulse TOF from orbit is related to "transmitter point-ahead", i.e. the offset between the center of the laser beam at the surface and where the receiver is looking one 2 msec round trip transit time later. For an unscanned system, the offset due to a 3 km/sec spacecraft ground velocity is only 6 m (slightly more than one resolution element) in the along-track direction and can be easily accommodated, either by a fixed offset of the transmitter in the positive along-track direction or by a modest increase in the receiver field of view (FOV). However, the scanner would need to complete a half cycle of its scan within the pulse TOF in order to contiguously map the ground track. Thus, the receiver FOV should be opened up to span the full 0.15 degree separation (766 m) between ground tracks in the cross-track dimension while the laser illuminates only a 5 m diameter circle within that FOV and defines the ground resolution element being interrogated. This approach increases the solar background noise incident on the detector during local daytime operations relative to the unscanned case and elevates the laser output energy requirements for good discrimination of the signal.

The surface return rate of an Earth orbiting altimeter can be increased by two to four orders of magnitude for a given laser output power by emitting the available photons in a high frequency (several kilohertz) train of low energy (approximately one milliJoule) pulses as opposed to a low frequency train of high energy pulses and employing single photon detection. This mode of operation reduces the chance of internal optical damage to the laser, thereby improving long-term reliability. In addition, these high return rates can often be accomplished with smaller telescope apertures due to the single photon sensitivity.

An imaging LIDAR system for use onboard an aircraft or spacecraft for three-dimensional and polarization imaging of topographic surfaces and volumetric scatterers that can alleviate many of the above problems is disclosed in the U.S. patent application Ser. No. 11/683,549 entitled: "Scanner/Optical System for Three-Dimensional LIDAR Imaging & Polarimetry" by Degnan et al., incorporated here by reference in its entirety. The three-dimensional scanning LIDAR/Polarimeter disclosed in the U.S. patent application Ser. No. 11/683,549 utilizes a pulsed solid state laser with beam divided in an array of 10×10 quasi-uniform beamlets. The pulse rate of the laser is used as a clock signal to synchronize the rotation rates of rotating wedges arranged and configured to function as an external dual wedge scanner. The scanner is positioned externally in front of a light collecting optical element of a telescope as observed from the direction of topographic surfaces and volumetric scatterers.

The imaging LIDAR/Polarimeter disclosed in the U.S. patent application Ser. No. 11/683,549 related to an interest in providing a globally contiguous topographic map of Jupiter's satellite Europa with a spatial resolution of better than 10 m and a vertical range resolution at the decimeter level. This was one of three topographic and polarimetric maps to be completed under the proposed Jupiter Icy Moons Orbiter (JIMO) mission along with the larger moons Callisto and Ganymede. Relatively short mission duration (1 to 3 months) is dictated largely by the anticipated effects of Jupiter's intense radiation field on electronics longevity and reliability.

This imaging LIDAR/Polarimeter system confirmed the feasibility of a Europa mapping mission demonstrating the desired improvements in sensitivity, contrast, angular resolution, and wide angular FOV relative to conventional scanning systems of prior art. Nevertheless, the size, mass, and angular momentum of the scanner is driven by the minimal aperture of the light-collecting optical element of the telescope. The internal scanners in accordance with one aspect of the present invention, are integrated inside of the telescope, and offer significant reductions in size, mass, and angular momentum of the combined internal scanner-telescope system and may also preserve or further improve optical and scanning qualities and performance of the entire LIDAR/Polarimeter system.

SUMMARY OF THE INVENTION

One embodiment of the current invention relates to a scanning instrument including a fixed telescope and incorporating an optical dual wedge scanner comprising a first optical wedge, a second optical wedge, and a controller arranged to control a synchronous rotation of the first and second optical wedges. The wedges are constructed and arranged to scan laser light redirected by topological surfaces and/or volumetric scatterers, which redirect the light to a first converging optical element that receives the redirected light and transmits the redirected light to the scanner, and a second converging optical element within the light path between the first optical element and the scanner arranged to reduce an area of impact on the scanner of the beam collected by the first optical element.

One embodiment of the current invention relates to a scanning instrument including a fixed telescope and incorporating an optical dual wedge scanner comprising a first optical wedge, a second optical wedge, and a controller arranged to control a synchronous rotation of the first and second optical wedges. The wedges are constructed and arranged to scan the transmitted laser light across topological surfaces and/or volumetric scatterers, which redirect the light to a first converging optical element that receives the redirected light and transmits the redirected light to the scanner, and a second converging optical element within the light path between the first optical element and the scanner arranged to reduce an area of impact on the scanner of the beam collected by the first optical element.

Another embodiment of the invention relates to a 3D imaging system which incorporates a light source that can emit a beam of light, a telescope with internal scanner that includes an optical dual wedge scanner comprising a first optical wedge, a second optical wedge, and a controller arranged to control a synchronous rotation of the first and second optical wedges, the wedges constructed and arranged to scan light redirected by topological surfaces and/or volumetric scatterers, a first converging optical element that receives the redirected light and transmits the redirected light to the scanner, and a second converging optical element within the light path between the first optical element and the scanner arranged to reduce an area of impact on the scanner of the beam transmitted by the first optical element. A detector module can be arranged to detect light collected by the telescope and generate signals responsive to the detected light, and a processor may be used to process signals generated by the detector.

Another embodiment of the current invention relates to a scanning instrument including a fixed telescope and incorporating an optical wedge scanner comprising a single optical wedge, and a controller arranged to control a rotation of the optical wedge. The wedge is constructed and arranged to scan laser light redirected by topological surfaces and/or volumetric scatterers, which redirect the light to a first converging optical element that receives the redirected light and transmits the redirected light to the scanner, and a second converging optical element within the light path between the first optical element and the scanner arranged to reduce an area of impact on the scanner of the beam collected by the first optical element.

Another embodiment of the current invention relates to a scanning instrument including a fixed telescope and incorporating an optical wedge scanner comprising a single optical wedge, and a controller arranged to control a rotation of the optical wedge. The wedge is constructed and arranged to scan the transmitted laser light across topological surfaces and/or volumetric scatterers, which redirect the light to a first converging optical element that receives the redirected light and transmits the redirected light to the scanner, and a second converging optical element within the light path between the first optical element and the scanner arranged to reduce an area of impact on the scanner of the beam collected by the first optical element.

Another embodiment of the invention relates to a 3D imaging system which incorporates a light source that can emit a beam of light, a telescope with internal scanner that includes an optical wedge scanner comprising a single optical wedge and a controller arranged to control a rotation of the optical wedge. The wedge is constructed and arranged to scan light redirected by topological surfaces and/or volumetric scatterers, a first converging optical element that receives the redirected light and transmits the redirected light to the scanner, and a second converging optical element within the light path between the first optical element and the scanner arranged to reduce an area of impact on the scanner of the beam transmitted by the first optical element. A detector module can be arranged to detect light collected by the telescope and generate signals responsive to the detected light, and a processor may be used to process signals generated by the detector.

Other objects, features and aspects of the invention will become apparent from the following detailed description, the accompanying drawings, and the appended claims.

BRIEF DESCRIPTION OF THE DRAWINGS

The novel features that are considered characteristic of the invention are set forth with particularity in the appended claims. The invention itself; however, both as to its structure and operation together with the additional objects and advantages thereof are best understood through the following description of the preferred embodiment of the present invention when read in conjunction with the accompanying drawings, wherein:

DETAILED DESCRIPTION OF THE INVENTION

While the invention has been shown and described with reference to a particular embodiment thereof, it will be understood to those skilled in the art, that various changes in form and details may be made therein without departing from the spirit and scope of the invention.

As indicated above, one practical way to generate a continuous topographic map of topographic surfaces from an airborne or spaceborne platform is to use an array of laser beamlets scanned at high speed over the topographic surface and to collect the laser light redirected by the surface into a telescope with internal scanner arranged to feed a photon-counting, focal plane, detector array matched to the array of laser beamlets. In scanner embodiments for spaceborne applications, scanners incorporating uniformly rotating optical elements may be desirable at least because of their inherent simplicity in design, operation and control, reliability, and low power consumption. In the case of embodiments using dual counter-rotating wedge scanners, there may be a benefit of low or vanishing total angular momentum, resulting from near cancellation of opposite contributions from each rotating component, so that no angular momentum is imparted to the spacecraft. Dimensions and mass of the dual counter-rotating wedges scanners can be further minimized by proper design optimization. In the case of embodiments using a single wedge scanner, also referred to as a conical scanner, all of the outgoing and incoming rays occur at a fixed angled with respect to the telescope optical axis. As a result, it is possible to correct for spherical aberration and improve image quality over what is possible with a dual wedge scanner, particularly when utilizing larger scanner field's of view.

Single wedge scanners have a variety of other advantages over dual wedge scanners. Single wedge scanners are half the weight of dual wedge scanners. Single wedge scanners have better image quality of the multibeam spots on the detector, and corresponding less crosstalk between pixels, resulting from an ability to better correct for spherical aberration in telescope optics. Single wedge scanners also have fewer phase locked wedges.

Figure 1:
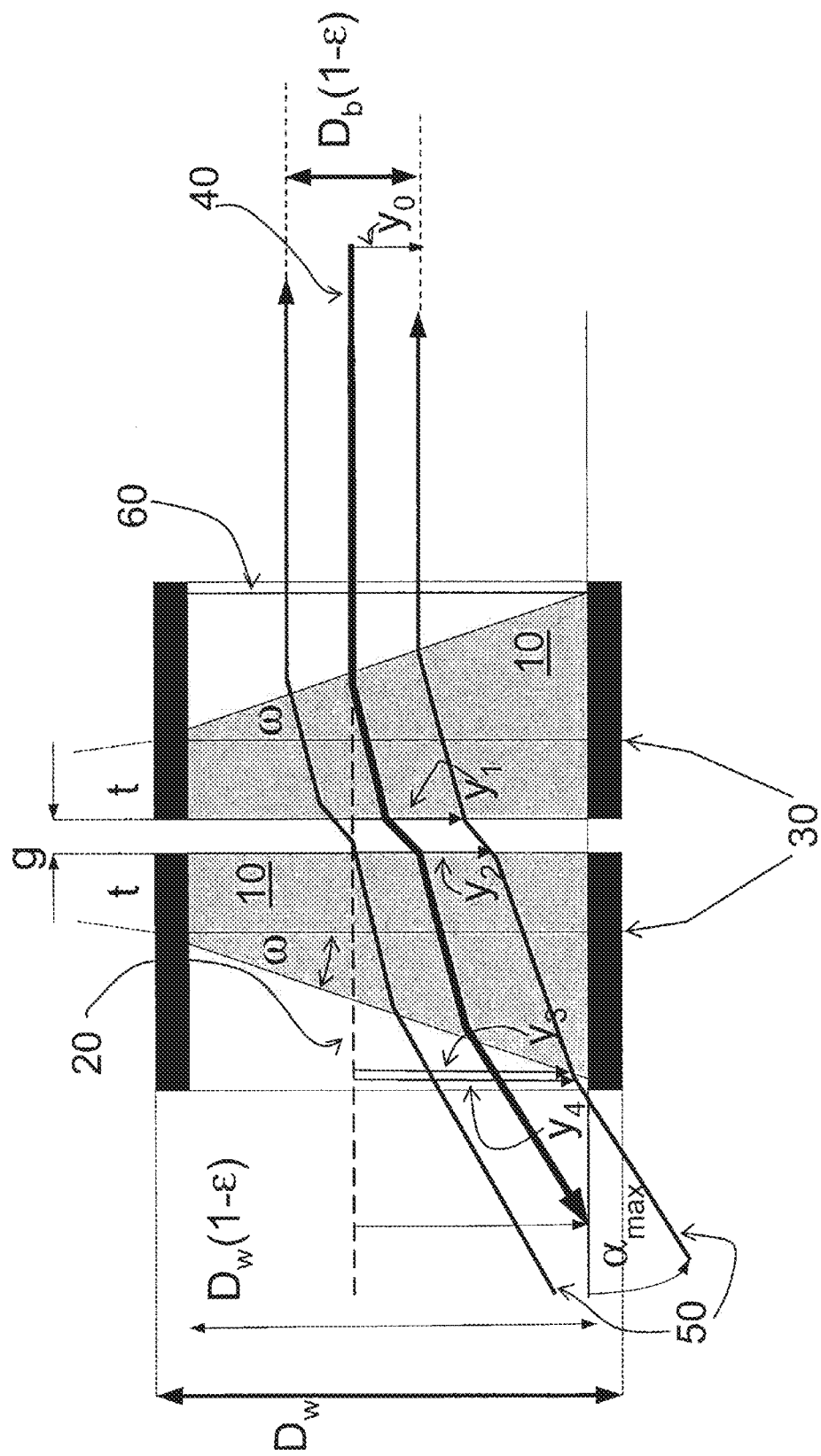
FIG. 1 is a schematic drawing of a dual wedge optical scanner according to an embodiment of the present invention.

A dual wedge scanner 100 is illustrated in FIG. 1 and incorporates two identical wedges 10 rotating in opposite directions about the optic axis 20. A single wedge scanner is formed of one of the wedges 10 only. Analysis of the counter-rotating dual wedge scanner has shown that offsetting the two prism holders 30 by 90° prior to spinning them in opposite directions at equal angular velocities yields a linear scan at 45 degrees to the aircraft or spacecraft velocity, the most uniform ground coverage and minimizes the scan speed for contiguous coverage if the diagonal of the beamlet array is oriented along the velocity vector. The maximum deflection angle produced by the scanner at the telescope exit aperture is determined by the desired ground swath width, s, and the spacecraft altitude, h, according to the equation:

$$\theta_{max} = \tan^{-1}\left(\frac{\sqrt{2}\,s}{2h}\right), \quad (1)$$

and occurs when the thick portions of the two wedges are oriented in the same direction as in FIG. 1. The collimated laser transmit beam 40 is typically injected through a hole in an annular mirror or alternatively via a small pickoff mirror in the center of the receiver field of view (not shown) and is therefore concentrated near the optic axis and travels from right to left in the figure. The outer rays, traveling from left to right in the figure, represent the extreme rays of the received beam 50 from the ground, which are reflected by the annular mirror (or pass by the central pickoff mirror) into the receiver. A small fraction of the received photons (~1%) is lost through the transmit hole of the annular mirror (or by reflection off the pickoff mirror). In order to capture all of the received rays, the scanner wedge diameter, $D_w$, must be chosen somewhat larger than the diameter of the optics following the scanner, $D_b$. For a scanner external to the primary telescope, $D_b=D_t$, the diameter of the telescope primary lens. For an internal scanner following the primary telescope with magnification m, $D_b=D_t/|m|$ is smaller but the ray angles exiting from the scanner must be enlarged by a factor |m| in order to achieve the same swath, i.e. $\alpha_{max}=|m|\theta_{max}$.

The collimated entrance laser transmit beam 40 and exit receive beam 50 are collinear with the optic axis 20, and hence the angle of incidence on the first prism is equal to the wedge angle, $\omega$.

Let $y_0$ be the displacement of a given parallel ray from the optic axis at the scanner entrance plane 60 as defined in FIG. 1. Ray tracing through the scanner provides the following exact expressions for the ray displacements $y_1$-$y_4$ from the optic axis 20 at various characteristic planes within the scanner.

Exit Face of First Wedge:

$$y_1 = y_0[1 + \tan\omega\tan(\omega-\beta)] - D_w\tan(\omega-\beta)\left(\varsigma + \frac{\tan\omega}{2}\right). \quad (2)$$

Entrance Face of Second Wedge:

$$y_2 = y_1 - g\left[\frac{n\sin(\omega-\beta)}{\sqrt{1-n^2\sin^2(\omega-\beta)}}\right]. \quad (3)$$

Exit Face of Second Wedge:

$$y_3 = y_2\left[1 + \frac{\sin\omega\sin(\omega-\beta)}{\cos(2\omega-\beta)}\right] - D_w\frac{\sin\omega\sin(\omega-\beta)}{\cos(2\omega-\beta)}\left(\varsigma + \frac{\tan\omega}{2}\right). \quad (4)$$

Exit Plane of Scanner (Perpendicular to Optic Axis 50):

$$y_4 = y_3(1 + \tan\alpha_{max}\tan\omega) - \frac{D_w}{2}\tan\alpha_{max}\tan\omega. \quad (5)$$

In the latter equations, $\omega$ is the wedge angle, g is the air gap between the wedges, $D_w$ is the diameter of the wedge, $t=\zeta D_w$ is the thickness of the wedge at its thinnest part, and $\beta$ is the refracted ray angle in the first wedge, i.e.

$$\sin\beta = \frac{\sin\omega}{n}, \quad (6)$$

where n is the refractive index of the wedge at the operating wavelength. For an exact solution, the latter equations can be solved sequentially ($y_0 \rightarrow y_1 \rightarrow y_2 \rightarrow y_3 \rightarrow y_4$) to follow the transmitter beam 40 rays from right to left in FIG. 1 through the scanner 100. Similarly, for the received beam 50 rays traveling from left to right, the same equations can be solved in reverse sequence ($y_4 \rightarrow y_3 \rightarrow y_2 \rightarrow y_1 \rightarrow y_0$) to obtain the displacement from the optical axis 20 of a ray at a boundary of the received beam 50 ("extreme" ray) as it exits the scanner entrance plane 60. This parametric model, however, treats the minimum wedge diameter, $D_w$, as an unknown to be solved for in order to minimize the size of the scanner. Equations (2) through (5) then become a system of four linear equations with up to six unknowns ($y_0, y_1, y_2, y_3, y_4, D_w$). The number of unknowns is reduced to four by applying two additional constraints, i.e. (1) setting either $y_0$ or $y_4$ equal to the displacement of an extreme ray from the optic axis; and (2) setting the displacement of the corresponding extreme ray at the opposite plane of the scanner equal to $D_w(1-\epsilon)/2$.

The beam diameter to the right of the scanner is given by:

$$D_b = \frac{D_1(1-\varepsilon)}{|m|}, \quad (7)$$

where $D_l$ is the primary diameter, |m| is the absolute value of the telescope magnification, and $\epsilon$ is the fraction of the optical diameter obscured by the prism holders 30.

Given the final beam diameter, one can simultaneously solve equations (2) through (6) for the minimum wedge diameter that just passes the extreme ray. If we make the simplifying assumption that the narrow air gap makes a negligible contribution to the overall ray displacement, one can obtain an approximate analytical expression for the minimum wedge diameter as a function of the exiting beam diameter to the right, $D_b$. After straight-forward algebraic manipulations, one can obtain the following expression for the minimum wedge diameter, $$D_w = \frac{D_b\gamma(\omega,\xi,n)}{(1-\varepsilon)} = \frac{D_1\gamma(\omega,\xi,n)}{|m|}, \quad (8a)$$

where we have used (7) as well as the following definitions (8b)-(8d) for the convenient notation:

$$\gamma(\omega,\xi,n) = \left\{\frac{1 - \tan\alpha_{max}\tan\omega - (2\xi+\tan\omega)}{\left[1 + \tan\alpha_{max}\tan\omega(1+\tan(\omega-\beta))\left[1 + \frac{\sin\omega\sin(\omega-\beta)}{\cos(2\omega-\beta)}\right]\right]}\right\}^{-1}, \quad (8b)$$

$$\beta(\omega,n) = a\sin\left(\frac{\sin\omega}{n}\right), \text{ and} \quad (8c)$$

$$\alpha_{max}(\omega,n) \equiv |m|\theta_{max} = a\sin\left\{\sin\omega\left[\frac{2\cos\omega\sqrt{n^2-\sin^2\omega}}{2\sin^2\omega-1} + \right] - \omega\right\} \quad (8d)$$

Where, as before, $\theta_{max}$ is the maximum scan angle, and n is the refractive index of the optical wedges.

Figure 2:
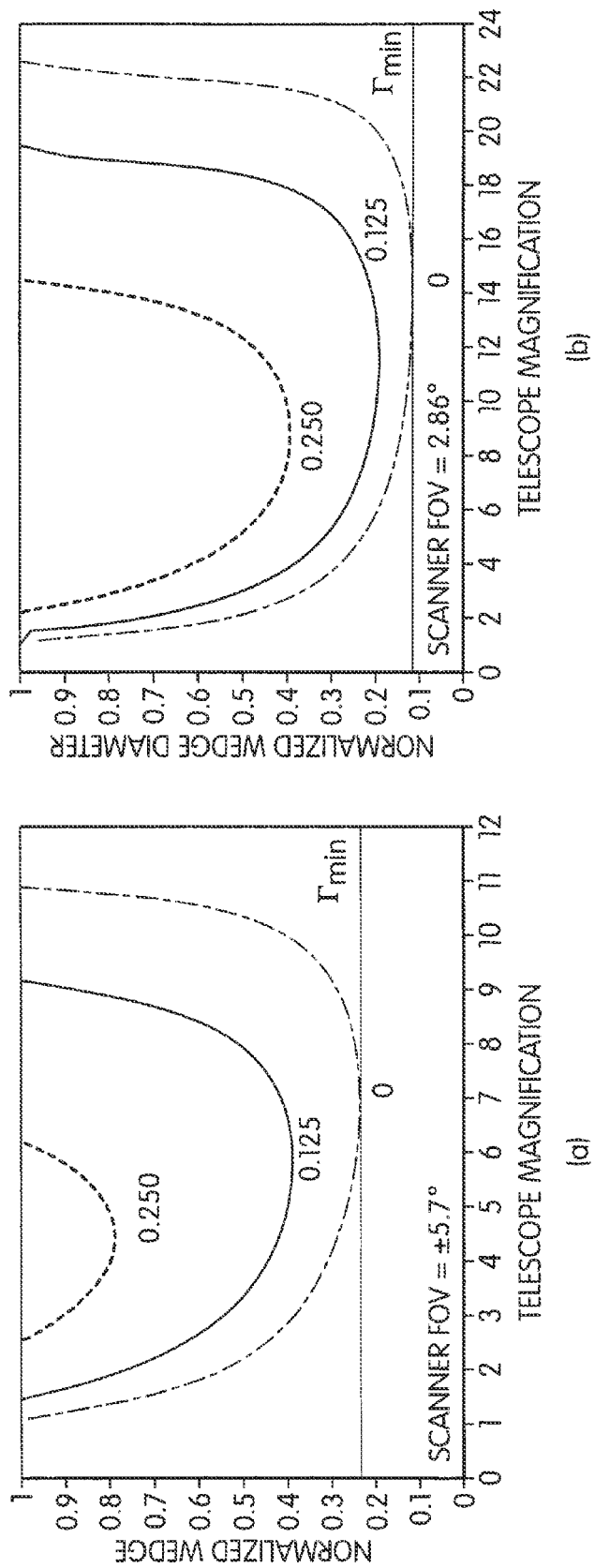
FIG. 2 shows dependencies of the internal wedge diameter normalized to the aperture of the telescope primary versus telescope magnification for: (a) FOV=±5.72° and (b) FOV=±2.86°.

Normalized Wedge Diameters $$\Gamma \equiv \frac{D_w}{D_l} = \frac{\gamma(\omega, \xi, n)}{|m|} \quad (9)$$

as a function of the various parameters are plotted in FIG. 2. The graphs in FIG. 2 indicate that the transverse dimension of the internal scanner 100 initially falls as the telescope magnification decreases, reaches a minimum, and then begins to rise. This behavior is a consequence of the fact that the diameter of the received beam decreases as the inverse of the magnification leading initially to a reduction in scanner size. At some point, however, the required ray deviation, $\alpha_{max} = |m|\theta_{max}$, becomes so large that the wedge angles (and the corresponding ray displacements within the scanner) begin to increase exponentially, driving up the scanner size, thereby creating a minimum wedge diameter and optimum magnification.

Figure 3:
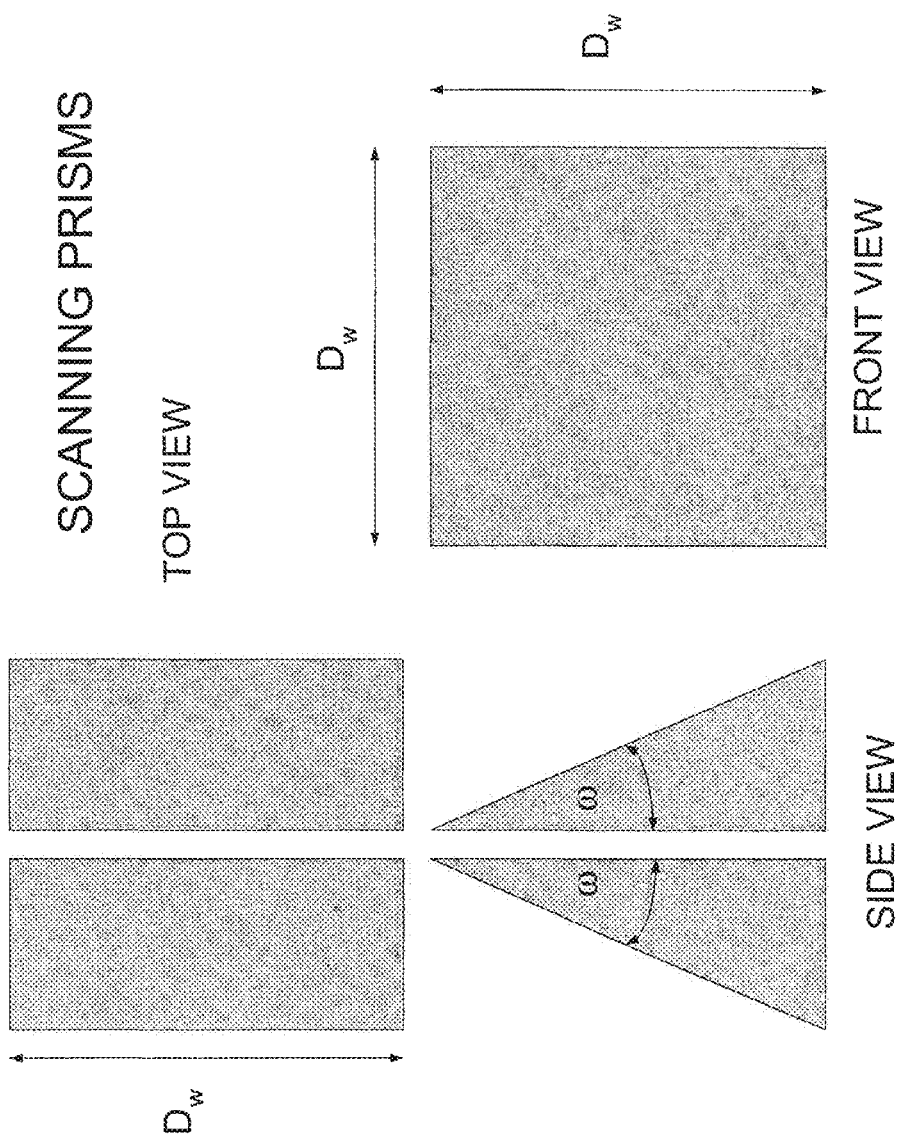
FIG. 3 is a schematic drawing of scanning prisms for a dual wedge scanner according to an embodiment of the present invention.

In addition, FIG. 2 indicates that choosing the narrow end of the wedge as thin as possible ($\xi \to 0$) allows designers to increase the magnification of the telescope thereby resulting in a smaller and lighter scanner. This follows from the fact that thicker wedges increase the size of the ray displacements within the scanner, thereby causing the minimum to form at lower magnifications and driving up the scanner size. Thus, instead of using the typical rounded optical wedges such as Risley prisms, it is advantageous to use two squared off prisms as the scanning elements as in FIG. 3, since this approximates the case $\xi = 0$ and minimizes the transverse dimensions of the internal scanner. FIG. 3 illustrates two scanning wedges. The use of two scanning wedges forms a dual wedge scanner. The use of just one of the illustrated scanning wedges forms a single wedge scanner.

The requirement to complete the map of Europa in one month resulted in the worst case scanner FOV of ±5.72°, for which the Normalized Wedge Diameters are illustrated in FIG. 2a. In this embodiment, an optimum telescope magnification of about 6.8 (corresponding to $\alpha_{max} = 39°$) would permit an internal scanner whose transverse dimension is 24% of the telescope aperture. If the mission time can be extended to two months, the Normalized Wedge Diameters as functions of telescope magnification are depicted in FIG. 2b, corresponding to a FOV=±2.86°. Here the telescope magnification can be doubled to about 13.6, resulting in an internal scanner whose transverse dimensions are half (0.12 $D_l$) of that required for a one month mission (0.24 $D_l$). In general, in embodiments exhibiting more moderate FOV's on the order of 1-2° (e.g. when mappings of extraterrestrial bodies can be extended due to more benign operating conditions than those encountered in the close proximity of Jupiter), telescope magnifications of ~20 can be used allowing the transverse dimension of the internal scanner to be less than 10% of the telescope aperture.

In general, the wedges in FIG. 3 begin to dominate the scanner size beyond the optimum value of $\alpha_{max}=39°$ so the optimum magnification for the prism wedges in FIG. 3 is typically equal to $39°/\theta_{max}$. Thicker, rounded wedges begin to dominate at even smaller magnification values as can be seen from FIG. 2.

All of the transmitter rays exit the scanner at a common angle with respect to the optic axis given by:

$$\alpha_{max} = \sin^{-1}\{\sin\omega[2\cos\omega\sqrt{n^2-\sin^2\omega}+2\sin^2\omega-1]\} - \omega \approx 2(n-1)\omega, \quad (10)$$

where the final approximation holds for sufficiently small wedge angles, $\omega$. Similarly, all the received rays exit the scanner parallel to the optic axis.

The internal scanner with minimum diameter rotating wedges 10 optimized for the given FOV in accordance with the above analysis must be integrated with an optimized telescope with aperture of the primary optical component $D_l$ and absolute magnification |m| chosen to correspond to the minimal scanner diameter in accordance with the equation (9). Embodiments using a conventional, two optical component telescope (a first converging optical element customarily identified as the "Primary Lens" and an exit optical element ("exit lens") customarily identified as an "Ocular" or an "Eyepiece") may not, for some applications, provide sufficient design flexibility for utilizing the optimized internal scanner with minimal diameter as determined from equation (9).

Figure 4:
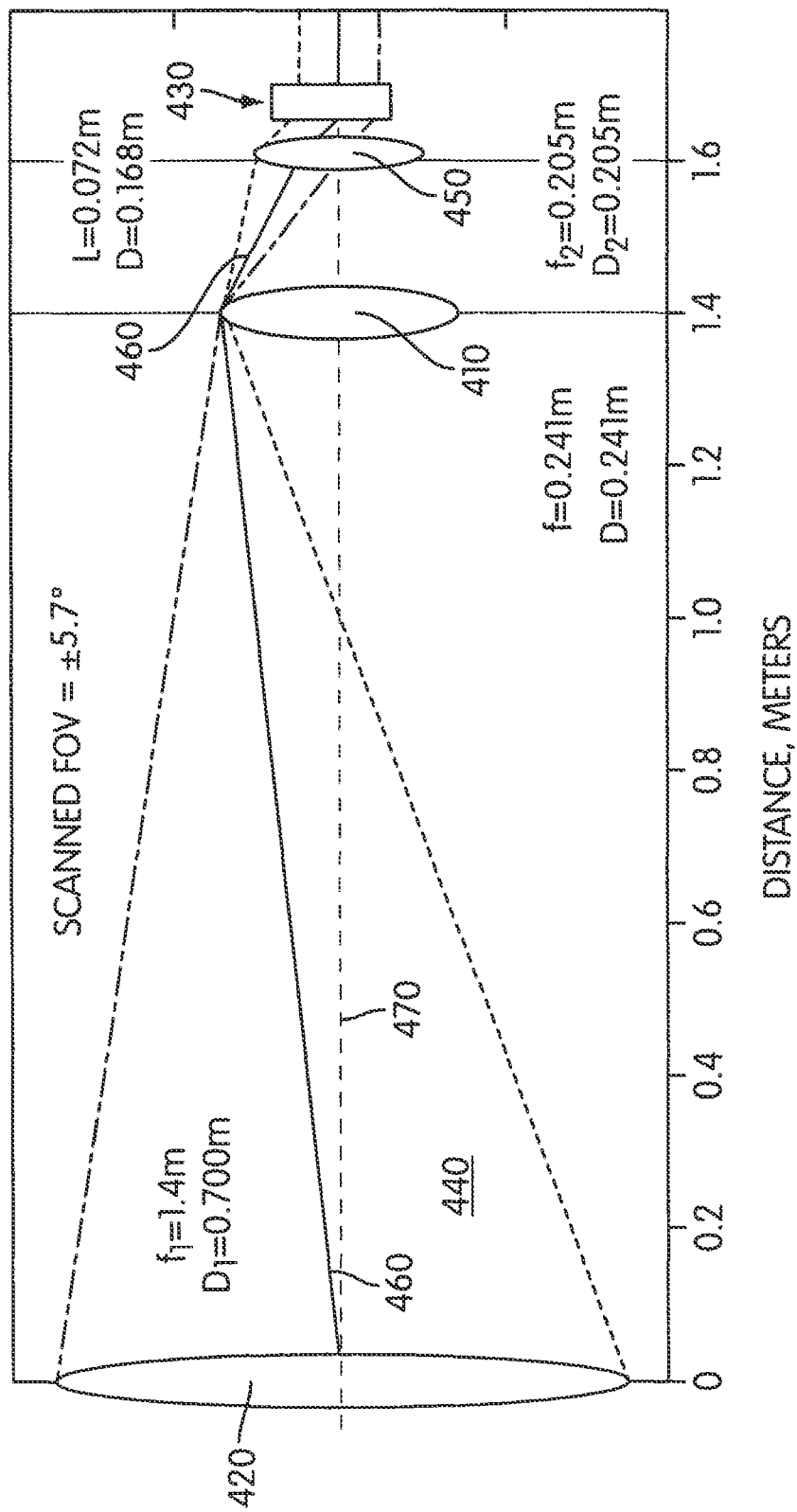
FIG. 4 is a schematic diagram of a telescope with internal scanner according to an embodiment of the present invention.

As illustrated in FIG. 4, in one embodiment the telescope with internal scanner incorporates an additional converging optical element ("field lens") at the common focal plane of the primary and exit lenses 410 in the light path between the first optical element 420 and the exit lens 450. The optical element 410, arranged to reduce an area of impact on the scanner 430 of the beam 440 collected by the first optical element 420, is shown schematically in FIG. 4. Scanner 430 may be either a dual wedge scanner or a single wedge scanner. For conceptual convenience, first optical element 420 is represented in FIG. 4 as a simple converging lens. It is important to realize that the present invention is not limited to the present embodiment. For example, a lens or a combination of lenses (as in a refractive telescope with internal scanner), any converging primary mirror (spherical, parabolic, hyperbolic, or a mirror with a composite curve cross-section) or a combination of mirrors and lenses (as well as other optical components) can be used as the first (primary) optical element 420 in accordance with one aspect of the present invention, as long as the chosen arrangement can collect sufficient light redirected by the topographic surfaces, volumetric scatterers, or other objects of interest. In one embodiment, a telescope with internal scanner using a known telescope configuration, like classic Cassegrain, Schmidt-Cassegrain, Maksutov-Cassegrain, Argunov-Cassegrain, Ritchey-Chrtien, or Dall-Kirkham, a scanner, and an optical element arranged to reduce an area of light impact on the scanner as disclosed above is consider to be an embodiment of the present invention.

Furthermore, it is not necessary for the telescope with internal scanner to use a coaxial arrangement of optical components as shown schematically on the embodiment in FIG. 4. Non-coaxial telescope configurations incorporating off-axis primary and secondary mirrors constructed and arranged, for example, to form configurations like: Schiefspiegler, Yolo, Multi-Schiefspiegler, and multi-mirror Yolo configurations can be used as a base for embodiments of telescope with internal scanners in accordance with the present invention.

As a particular example of the JIMO mission, the 70 to 100 cm diameter primary "lens" would actually be replaced by a mirror, but this fact does not influence significantly the analysis presented below, since converging lenses and converging mirrors are represented by analogous ray matrices, containing matrix elements that can be characterized by identical mathematical expressions. Therefore, modeling based on the embodiment shown in FIG. 4 yields results that can be applied to any appropriate reflector or refractor telescope configuration.

Considering the embodiment shown schematically in FIG. 4, a second converging optical element 410 (a "field lens"), with focal length f, is positioned at the common focal plane of the first optical element 420 ("primary") and an exit "lens" 450 of the generic two lens telescope having primary and exit focal lengths $f_1$ and $f_2$ respectively. An extreme ray entering the first optical element from the left of the FIG. 4 can be represented by the two dimensional ray vector $$\begin{vmatrix} x_0 \\ \alpha_0 \end{vmatrix} = \begin{vmatrix} \pm \dfrac{D_1(1-\varepsilon)}{2} \\ \pm \theta_{max} \end{vmatrix} \quad (11)$$

where, as before, $D_I$ is the primary diameter (linear aperture), $(1-\epsilon)$ is the fractional clear aperture of the primary optical element 420, and $\theta_{max}$ is the maximum scanner FOV half angle.

The extreme ray vectors at the second converging optical element 410 are obtained by applying the appropriate ray matrices to yield:

$$\begin{vmatrix} x_f \\ \alpha_f \end{vmatrix} = \begin{vmatrix} 1 & f_1 \\ 0 & 1 \end{vmatrix} \begin{vmatrix} 1 & 0 \\ -\dfrac{1}{f_1} & 1 \end{vmatrix} \begin{vmatrix} \pm \dfrac{D_1(1-\varepsilon)}{2} \\ \pm \theta_{max} \end{vmatrix} \quad (12)$$

$$= \begin{vmatrix} 0 & f_1 \\ -\dfrac{1}{f_1} & 1 \end{vmatrix} \begin{vmatrix} \pm \dfrac{D_1(1-\varepsilon)}{2} \\ \pm \theta_{max} \end{vmatrix}$$

$$= \begin{vmatrix} \pm f_1 \theta_{max} \\ \pm \theta_{max} \mp \dfrac{D_1(1-\varepsilon)}{2 f_1} \end{vmatrix},$$

which implies that the minimum diameter of the field lens, $D_f$, is proportional to both the scanner FOV and the focal length of the primary optical element, i.e.

$$D_f = \dfrac{2 x_f}{1-\varepsilon} = \dfrac{2 f_1 \theta_{max}}{(1-\varepsilon)}, \quad (13)$$

where $D_I$ is the primary diameter, $(1-\epsilon)$ is the fractional clear aperture of the primary optical element 420, and $\theta_{max}$ is the maximum scanner FOV half angle.

Continuing to propagate the extreme received rays to the output of the exit lens 450 via ray matrices yields $$\begin{vmatrix} x_2 \\ a_2 \end{vmatrix} = \begin{vmatrix} 1 & 0 \\ -\dfrac{1}{f_2} & 1 \end{vmatrix} \begin{vmatrix} 1 & f_2 \\ 0 & 1 \end{vmatrix} \begin{vmatrix} 1 & 0 \\ -\dfrac{1}{f_1} & 1 \end{vmatrix} \begin{vmatrix} \pm \dfrac{D_1(1-\varepsilon)}{2} \\ \pm \theta_{max} \end{vmatrix} \quad (16)$$

$$= \begin{vmatrix} -\dfrac{f_2}{f_1} & f_1 + f_2 - \dfrac{f_1 f_2}{f} \\ 0 & -\dfrac{f_1}{f_2} \end{vmatrix} \begin{vmatrix} \pm \dfrac{D_1(1-\varepsilon)}{2} \\ \pm \theta_{max} \end{vmatrix},$$

which leads to the following expressions for the position and output angle of the extreme rays at the output face of the exit lens 450:

$$x_2 = \mp \dfrac{f_2}{f_1} \dfrac{D_1(1-\varepsilon)}{2} \pm \left( f_1 + f_2 - \dfrac{f_1 f_2}{f} \right) \theta_{max} \quad (17)$$

$$= \mp \dfrac{D_1(1-\varepsilon)}{2|m|} \pm |m| f_2 \theta_{max} \left( 1 + \dfrac{1}{|m|} - \dfrac{f_2}{f} \right), \text{ and}$$

$$\alpha_2 = \pm \dfrac{f_1}{f_2} \theta_{max} = \mp |m| \theta_{max} \quad (18)$$

respectively, where the magnification of the telescope is given by $$m = -\dfrac{f_1}{f_2}. \quad (19)$$

In order to minimize the size of the scanner 430, the optical system needs to cause the central ray 460 (i.e. the ray propagating through the center of the primary optic 420) to intercept the optical axis at a distance $d_2$ beyond the exit lens 450 position, where:

$$d_2 = d_{min} + d_w = d_{min} + \dfrac{|\Delta y|}{\tan(\alpha_{max})} = d_{min} + \dfrac{D_1[1-\gamma(\omega,\xi,n)]}{2|m|\tan(|m|\theta_{max})} \quad (20)$$

is the sum of $d_{min}$, the minimum physical separation between the exit lens 450 and the scanner 430 entrance faces, and $d_w$, the distance from the scanner 430 entrance face to the point where the central ray 460 exiting the exit lens 450 would intercept the optic axis if the scanner 430 wedges were not present. This condition ensures that the incoming central ray is collinear with the receiver optic axis as it exits the scanner 430. Thus, continuing the trace of the central ray to this point internal to the scanner 430, one can write:

$$\begin{vmatrix} x_{sc} \\ \alpha_{sc} \end{vmatrix} = \begin{vmatrix} 1 & d_2 \\ 0 & 1 \end{vmatrix} \begin{vmatrix} -\dfrac{f_2}{f_1} & f_1 + f_2 - \dfrac{f_1 f_2}{f} \\ 0 & -\dfrac{f_1}{f_2} \end{vmatrix} \begin{vmatrix} 0 \\ \pm \theta_{max} \end{vmatrix} \quad (21)$$

$$= \begin{vmatrix} \pm \left( f_1 + f_2 - \dfrac{f_1 f_2}{f} - \dfrac{d_2 f_1}{f_2} \right) \theta_{max} \\ \mp |m| \theta_{max} \end{vmatrix} \equiv \begin{vmatrix} 0 \\ \mp |m| \theta_{max} \end{vmatrix},$$

where the final identity holds if and only if $$f_1 + f_2 - \dfrac{f_1 f_2}{f} - \dfrac{d_2 f_1}{f_2} = 0. \quad (22)$$

Solving for f in the latter equation yields:

$$f = \dfrac{f_1 f_2}{f_1 + f_2 + \dfrac{f_1 d_2}{f_2}}, \quad (23)$$

for the focal length of the field lens.

FIG. 4 shows a sample ray trace for a "three lens" telescope with internal scanner system that meets all the aforementioned conditions for the worst case scan angle of 5.72°. In this particular embodiment, one can consider a 70 cm primary with a focal length of 140 cm (F=2) and can calculate all of the other components' optical parameters by applications of the results of the analysis of this section in order to minimize the transverse dimensions of the internal scanner (about $0.24 D_I$=16.8 cm for the depicted embodiment).

The central and extreme rays entering the first optical element 420 from the left, are focused to a single point at the extreme upper edge of the field lens 410 and are further refracted by the exit lens 450 to produce three parallel rays at the dual wedge scanner 430 entrance face making an angle $\alpha_{max}$ with the optic axis. Upon passing through the scanner, the ray bundle exits parallel to the optic axis to the receiver with the central ray collinear with the optic axis 470. At the opposite end of the scan, the rays form a mirror image relative to the optic axis 470 with the central ray 460 again being collinear with the optic axis 470. If the central ray 460 intersected at a different point, it would exit the scanner parallel to, but not collinear with, the optic axis 470 and would shift to the opposite side at the other scan limit. As a result, the transverse dimensions of the scanner would have to be increased to accommodate this translation.

Thus, the addition of the second optical element 410 to the telescope reduces the size of the exit lens 450, permits the central ray to be made collinear with the optic axis 470, and significantly extends the allowed magnification range. The latter two factors in turn reduce the size of the internal scanner.

Figure 5:
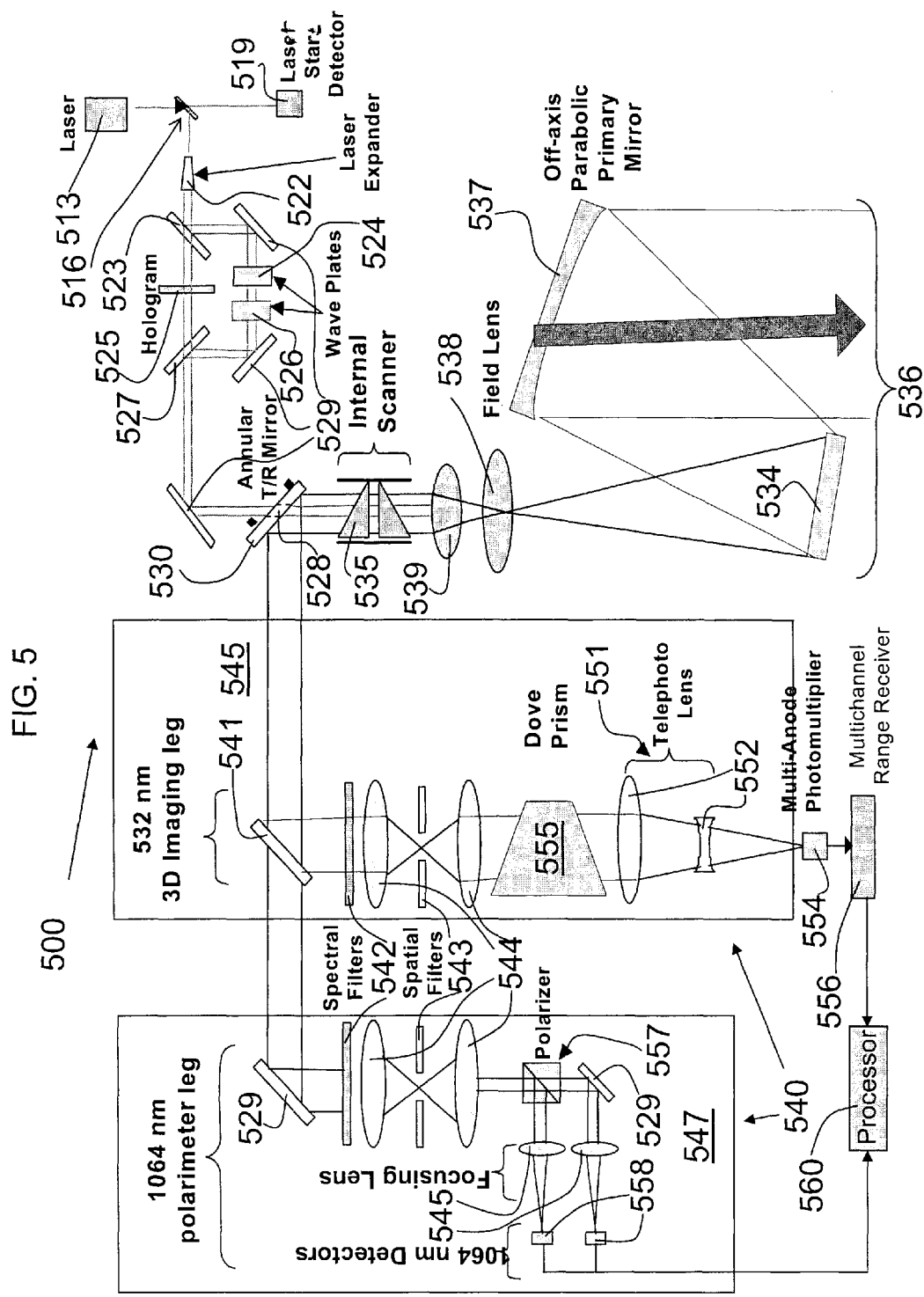
FIG. 5 is a schematic drawing of a 3D imaging LIDAR/Polarimeter according to an embodiment of the present invention.

FIG. 5 depicts a schematic view of an embodiment of a combined three-dimensional LIDAR imager/laser polarimeter 500 that incorporates an integrated telescope with internal scanner 536 in accordance with the present invention. A small fraction of the outgoing laser pulse from a frequency-doubled Nd:YAG microchip laser 513 is transmitted through a high reflectivity splitter mirror 516 and detected by pulse detector 519 which provides a start pulse for a multichannel range receiver 556.

The visible 3D imaging beam at 532 nm is expanded by laser beam expander 522 to about 5 mm diameter and input to a Holographic Optical Element (HOE) 525, which forms a 10×10 array of beamlets creating quasi-uniform intensity spots in the far field of the LIDAR/Polarimeter 500. In this embodiment, about 80% of the original laser energy is shared roughly equally within the 10×10 array of far field spots with the remainder lost to higher orders of the HOE 525 which lie outside the receiver field of view (FOV). The orientation of the transmitted spots relative to the scan direction can be adjusted by rotating the HOE 525 in its holder (not shown) about the transmitter optical axis. It should be noted that in different embodiments of the invention different methods of forming different beamlet arrays can be implemented. For example, diffractive optical elements, liquid crystal arrays, or micromirror arrays can be used to form beamlet arrays.

The near infrared (polarimeter) beam at 1064 nm is reflected by a dichroic beam splitter 523 and, for the most efficient type II doubling crystals of the current embodiment, it is elliptically polarized. A first quarter-wave plate 524 is used to linearize the polarization while a second half-wave plate 526 rotates the linearly polarized light to the desired orientation.

The transmitted imaging and polarimetric beams are recombined at a second dichroic beam splitter 527 and then passed with approximately 100% efficiency through the central hole 528 of an annular Transmit/Receive mirror 530, to the dual wedge scanner 535 of a telescope with internal scanner 536. As disclosed in FIG. 5, the telescope with internal scanner 536 incorporates a first converging optical element (e.g. an off-axis parabolic primary mirror) 537, a planar mirror 534, a second converging optical element (field lens) 538, an exit lens 539, and an internal scanner 535. While FIG. 5 illustrates the use of a dual wedge scanner 535, the use of a dual wedge scanner 535 is merely exemplary. Dual wedge scanner 535 may be replaced by a single wedge scanner.

Photons reflected from topological surfaces and/or volumetric scatterers in the target area are collected by the telescope with internal scanner 536, and the majority of photons are reflected by the annular mirror 530 to the dichroic mirror 541 which in turn sends the visible green photons into the 3D imaging channel (532 nm leg) 545 and the infrared photons into the polarimetry channel (1064 nm leg) 547. Spectral filters 542 and spatial filters 543, located in both the imaging channel 545 and polarimetry channel 547, in cooperation with focusing elements 544, restrict the noise background.

In the imaging channel 545, two lenses are arranged to form a telephoto (long focal length) lens 551 that images the 10×10 far field pattern onto a multichannel photodetector 554. In the embodiments in FIGS. 5 and 6 the multichannel photodetector is a 10×10 Hamamatsu segmented anode microchannel plate photomultiplier (MCP/PMT). It is relevant to note that other types of multichannel photodetectors such are, but not limited to, photodiodes and photodiode arrays, PIN diodes and PIN diode arrays, phototransistors and phototransistor arrays, or CCD and CMOS based photodetector arrays also can be used without exceeding the limits of the current invention. Each of the 100 images on the photocathode is relayed by the internal microchannel plates to an individual anode in the 10×10 anode array. The orientation of the received image of the 10×10 spot array can be matched to that of the anode (or APD) array via a Dove prism 555 rotated about the optical axis in the 3D imaging leg 545. A 100 channel, multistop multichannel range receiver 556 records arrival times of the start pulses from start detector 519, multiple single photon stop events (including noise) detected by the MCP/PMT 554, timing pulses from the onboard clock, and once per revolution synchronization pulses from the rotating scanner wedges. This timing information is used by onboard processor 560 to generate pulse time-of-flight (TOF) measurements, which combined with navigation, attitude, and scanner pointing data are used to create a 3D map of the underlying terrain.

In the polarimetry leg 547, the returning photons are separated by polarizer 557 into two beams based on polarization. Each beam is focused using separate focusing lenses 545 and the light intensities are detected by at least two photodetectors 558. Resulting signals are recorded and processed by processor 560 to determine and map the amount of depolarization caused by the target. Depending on the particular embodiment, the polarimetry data can be mapped independently or analyzed integrally in correlation with the 3D visible data. In addition, by adding two additional polarization channels and data processing, the system can be augmented for full recovery of the Stokes parameters if desired.

Figure 6:
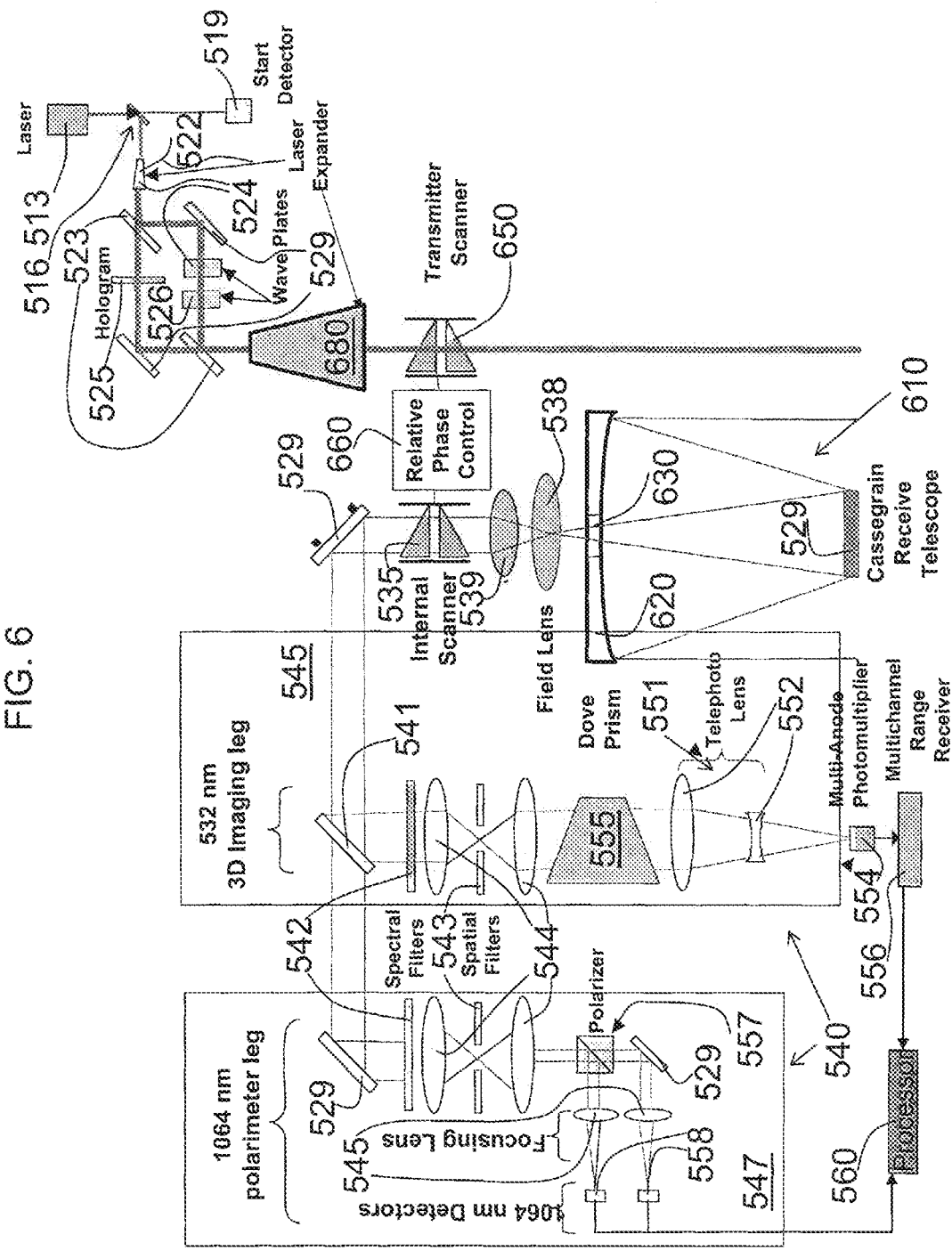
FIG. 6 is a schematic drawing of an imaging LIDAR/Polarimeter according to another embodiment of the present invention.

A different embodiment employing a "bistatic" optical configuration, shown in FIG. 6 (all analogous elements performing identical functions in bistatic embodiment shown in FIG. 6 and monostatic embodiment shown in FIG. 5 and discussed above, are denoted by common reference numerals in FIGS. 5 and 6), separates the optical trains of the transmitter and receiver and avoids use of the off-axis primary mirror 537 configurations of the "monostatic" shared aperture approach (FIG. 5), while still allowing the use of the telescope with internal scanner with a field lens 630 in the receiver path. More conventional telescope designs, such as the Cassegrain 610 in FIG. 6, can now be utilized. Similar to the embodiment shown in FIG. 5, the telescope 610 includes a second converging optical element (field lens) 538, an exit lens 539 and an internal scanner 535 but, the primary mirror 620 is of Cassegrain type incorporating a secondary flat mirror 534 and a central opening 630. Since the secondary mirror 534 in the Cassegrain partially obscures the free aperture of the primary mirror 620, the aperture may be increased appropriately in order to maintain the same effective receive aperture and signal strengths.

The embodiment in FIG. 6 incorporates a separate transmitter optical dual wedge scanner 650 in addition to the internal scanner 535. Both, the internal scanner 535 and the transmitter scanner 650 are of the type disclosed above in FIGS. 1-4, and are synchronized with the laser 513 pulse train by using a controller 660 arranged to adjust the relative rotational phases of individual wedges within scanners 535 and 650 for independent pointing of the transmitter beam and the receiver optical axis. The imaging leg 545 and the polarimeter leg 547 of the bistatic embodiment are identical in design and function with the parts 545 and 547 in FIG. 5, discussed above. While FIG. 6 illustrates the use of a dual wedge scanner 535, the use of a dual wedge scanner 535 is merely exemplary. Dual wedge scanner 535 may be replaced by a single wedge scanner. In addition, the use of a dual wedge scanner 650 is merely exemplary. Dual wedge scanner 650 may be replaced with a single wedge scanner.

Additional difference between the embodiments with bistatic (FIG. 6) and monostatic configuration (FIG. 5) relates to the fact that bistatic configuration can replace the annular Transmit/Receive mirror 530 with a simple mirror 670 and eliminate laser backscatter into the sensitive receivers while improving the light collection efficiency by avoiding losses associated with the annular opening.

Embodiments utilizing bistatic configuration also avoid focusing of the transmitter beam in, and possible optical damage to the field lens 538 as in the monostatic configuration of FIG. 5.

The bistatic configuration also provides the ability to adjust the relative instantaneous pointing of the transmit beam and receiver for different operational altitudes (e.g. for mapping of different Moons of Jupiter or other planets), or to compensate for widely varying elevations in the lunar surfaces. By electronically adjusting the timing between synchronization pulses in the scanner output, using the scanner controller 660 with range input from the processor 560, the relative rotational phase between the corresponding wedges in the transmit and receive scanners can be modified in-flight to provide the proper transmitter point-ahead for any satellite-to-surface distance so that the receiver is always looking at the ground spot illuminated by the laser independent of target range.

It should be emphasized that both bistatic configuration in FIG. 6 and monostatic configuration in FIG. 5 represent two different classes of embodiments of the current invention. Many variations, known in the art, may be included in particular embodiments without exciding the limits of the current invention.

Figure 7:
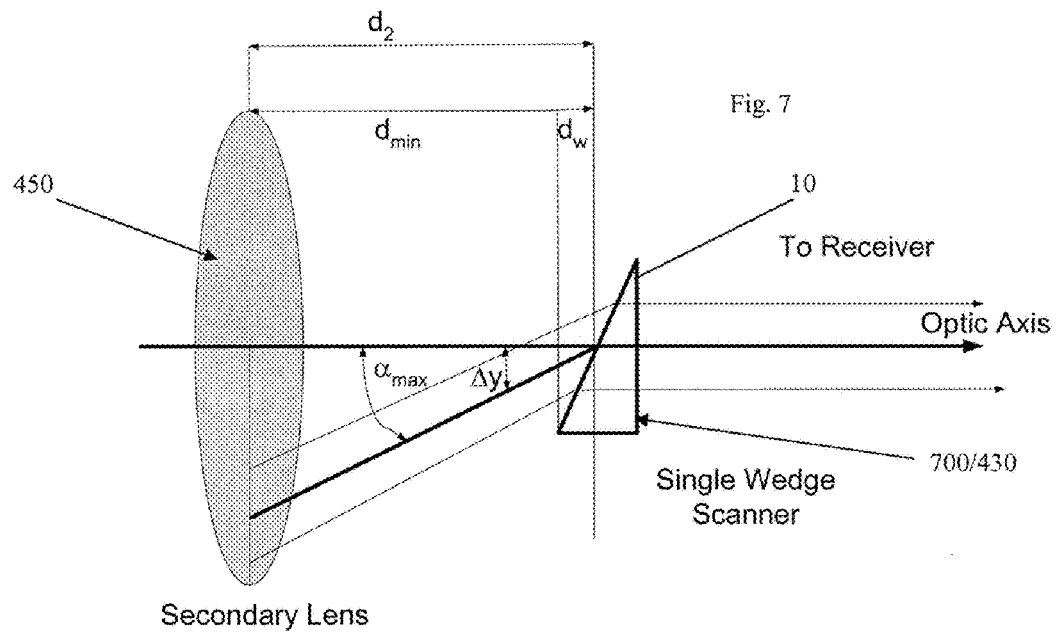
FIG. 7 is a schematic diagram of an internal single wedge scanner and an internal dual wedge scanner showing the secondary lens of the telescope.
Figure 7:
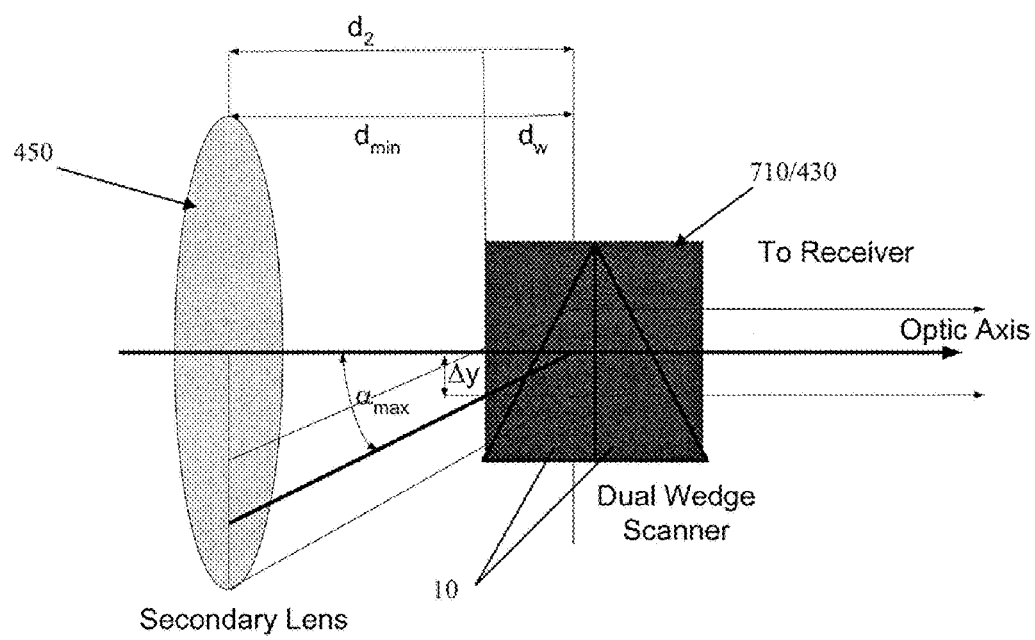

FIG. 7 is a schematic diagram of an internal single wedge scanner 700 and an internal dual wedge scanner 710 showing the secondary lens of the telescope 450. Single wedge scanner 700 and dual wedge scanner 710 are both configured to form the scanners 430, 535, and 650. The present invention offers numerous advantages, including: (1) a several degree scanner FOV; (2) narrow instaneous FOV; (3) low field distortion for high fidelity optical 3D imaging; (4) greatly reduced size, weight, and prime power consumption relative to an external scanner; (5) four orders of magnitude reduction in noise background relative to a scanning transmitter/fixed receiver FOV configuration; (6) significantly lower transmit and receiver prime power consumption relative to a pushbroom approach; (7) can acccommodate transmit point ahead at a variety of orbital altitudes and scan speeds; (8) scan speed can be synchronized to laser pulse train for two to three orders of magnitude reduction in onboard ancillary data storage and transmission related to geolocation of the pulses on the surface; (9) synchronization approach allows the transmitter and receiver to be scanned independently in a bistatic optical configuration to suppress laser backscatter; and (10) can be used with a multibeam lidar and focal plane array detector.

Aside from interplanetary exploration, the present invention has a variety of commercial applications including: scanning lidars or passive spectral sensors operating in high altitude aircraft or orbiting spacecraft for the purposes of military reconnaisance and surveillance; 3D topographic measurements of planetary and lunar surfaces; volumetric measurements of tree canopies and forest management; cloud and aerosol distributions in the atmosphere; high resolution large scale surveying; border security; and land use management. The present invention allows photon-counting lidars to operate with larger telescopes from much higher altitudes without an increase in scanner size, mass or prime power consumption. Other commercial suppliers of non-photon-counting airborne laser altimeters (the largest of which is Optech in Canada) use orders of magnitude higher power lasers and either external scanners or a scanned transmitter within a large receiver FOV.

Best imaging results for the present invention are obtained with an internal conical scanner (e.g. optical wedge, holographic, or diffractive element). The telescope/internal scanner optical configuration according to the present invention are analyzed using a paraxial ray model and validated/refined via ZEMAX® software analysis.

Figure 8:
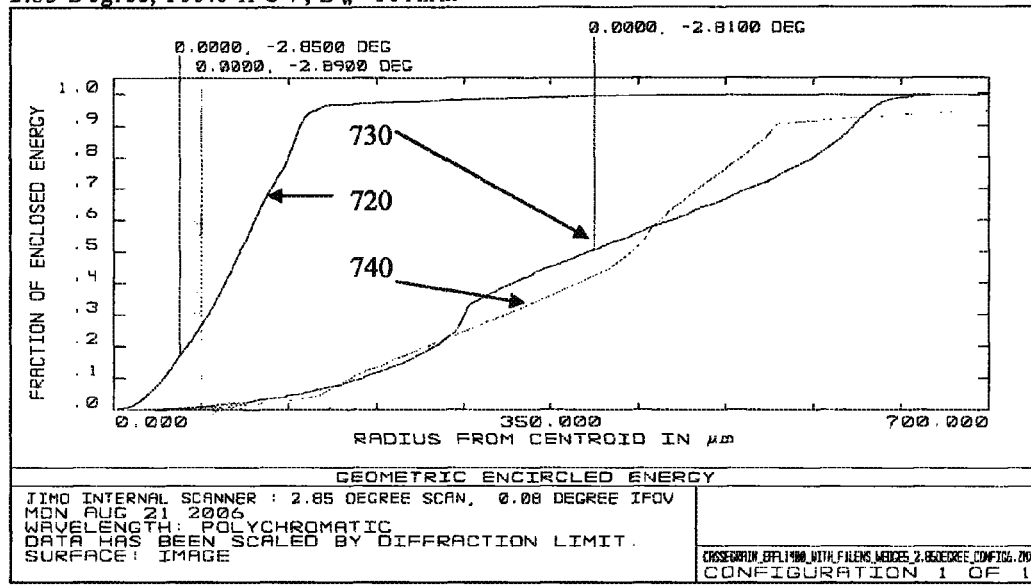
FIGS. 8 and 9 provide ZEMAX® plots of the encircled energy per detector pixel as a function of radius from the pixel center for the internal conical scanner with cone half-angles of 2.85 and 1.9 degrees respectively according to one embodiment of the present invention.
Figure 9:
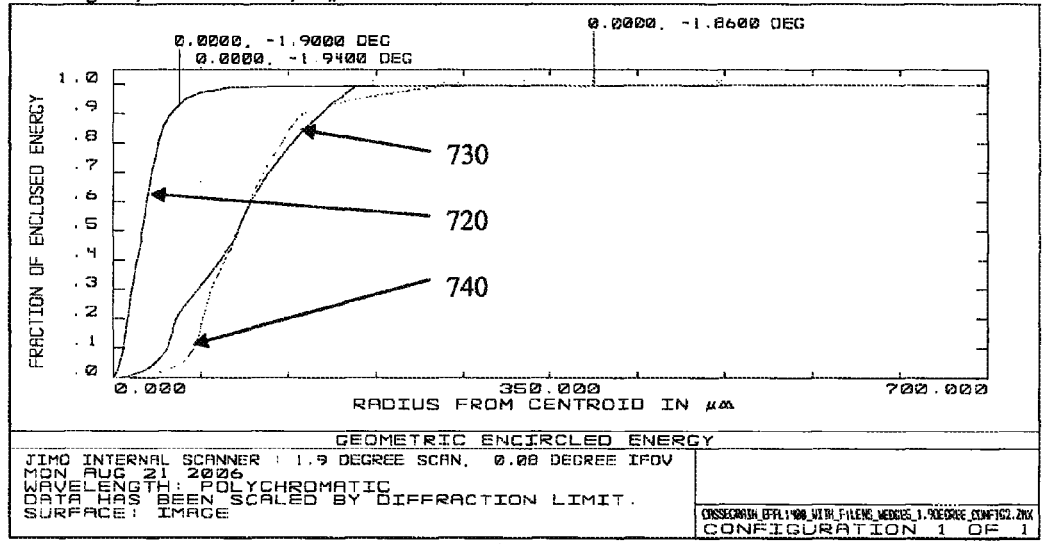

ZEMAX®, www.zemax.com, is software that aids optical engineering in lens design, illumination, laser beam propagation, stray light, freeform optical design and many other applications. FIGS. 8 and 9 provide ZEMAX plots of the encircled energy per detector pixel as a function of radius from the pixel center for the internal single wedge scanner with cone half-angles of 2.85 and 1.9 degrees respectively. These half-angles correspond to the cone angles required to contiguously map Europa within 2 and 3 months respectively. For the Hamamatsu 10×10 segmented anode microchannel plate photomultiplier chosen as the array detector, each square pixel measures about 1.6 mm on a side, and hence the horizontal axis varies from 0 to 800 microns. The aperture of the internal scanner for both plots is set to a constant 10 cm, comparable to that of a prototype scanner developed under this program and described in the next sub-section. In each plot, curve 720 corresponds to one of the central pixels in the 10×10 focal plane detector array whereas the curves 730 and 740 correspond to the beamlet images falling within the extreme pixels at the outside and inside corners of the array respectively. For both cone angles and all pixels, the individual beamlet return energies are well-contained within their respective pixels although the image sizes are smallest for the central pixels as well as for smaller cone angles.

The cone half angle would increase to 5.7 degrees if the local radiation field made it necessary to shorten the duration of the Europa mapping mission to one month. The ray analysis, summarized in FIGS. 8 and 9, show that a large internal scanner aperture (~168 mm) is desirable.

While the invention has been shown and described with reference to a particular embodiment thereof, it will be understood to those skilled in the art, that various changes in form and details may be made therein without departing from the spirit and scope of the invention.

We claim:
1. A telescope with internal scanner comprising:
    a wedge optical scanner including a first optical wedge and
        a controller arranged to control a synchronous rotation of the first optical wedge, the wedge being constructed and arranged to scan light over predetermined topologi- cal surfaces and/or volumetric scatterers and to deflect the light redirected by the topological surfaces and/or volumetric scatterers;

a first converging optical element that receives the redirected light and transmits the redirected light as a beam along a predetermined light path toward the scanner; and a second converging optical element positioned within the light path between the first optical element and the wedge optical scanner, the second converging optical element being disposed to converge the redirected light toward the wedge optical scanner and to reduce an area of impact on the wedge optical scanner of the beam collected by the first optical element.

2. The telescope with internal scanner of claim 1, the wedge optical scanner further comprising a second optical wedge, wherein the controller is arranged to synchronize the rotation of the first and second optical wedge to a laser pulse rate.

3. The telescope with internal scanner of claim 2 wherein the synchronization of the rotation of the wedges is achieved utilizing laser pulses rate as a clock oscillator frequency.

4. The telescope with internal scanner of 2 wherein the laser pulse rate is in the kilohertz range.

5. The telescope with internal scanner of claim 2 wherein the laser pulse rate is between 8 kHz and 30 kHz.

6. The telescope with internal scanner of claim 1, wherein the first converging optical element is a primary converging optical element.

7. The telescope with internal scanner of claim 6, wherein the primary converging optical element is a converging mirror.

8. The telescope with internal scanner of claim 7, wherein the telescope further comprises a secondary mirror.

9. The telescope with internal scanner of claim 8, wherein the primary and secondary mirrors are constructed and arranged to form a Cassegrain configuration.

10. The telescope with internal scanner of claim 9, wherein the Cassegrain configuration is chosen from a group of Cassegrain configurations consisting of: classic Cassegrain, Schmidt-Cassegrain, Maksutov-Cassegrain, Argunov-Cassegrain, Ritchey-Chretien, and Dall-Kirkham.

11. The telescope with internal scanner of claim 7, wherein the converging mirror is an off-axis primary mirror.

12. The telescope with internal scanner of claim 11, wherein the off-axis primary mirror is an off-axis parabolic primary mirror.

13. The telescope with internal scanner of claim 11, further comprising at least one secondary mirror wherein the off-axis primary and the secondary mirrors are constructed and arranged to form a configuration chosen from a group of configurations consisting of: Schiefspiegler, Yolo, Multi-Schiefspiegler, and multi-mirror Yolo configurations.

14. The telescope with internal scanner of claim 1, wherein the telescope has a linear aperture smaller than 200 cm.

15. The telescope with internal scanner of claim 1, wherein the telescope has a linear aperture smaller than 100 cm.

16. The telescope with internal scanner of claim 1, wherein the telescope has a linear aperture smaller than 50 cm.

17. The telescope with internal scanner of claim 1, wherein the optical dual wedge scanner is constructed and arranged to simultaneously scan light emitted by a laser and the light redirected by topological surfaces and/or volumetric scatterers.

18. The telescope with internal scanner of claim 1, wherein the optical dual wedge scanner is positioned coaxially adjacent to the second converging optical element on the opposite side of the second converging optical element relative to the side of the converging optical element where the first converging optical element is positioned.

19. The telescope with internal scanner of claim 1, wherein the optical dual wedge scanner has a wedge diameter smaller than a linear aperture of the telescope.

20. The telescope with internal scanner 1, wherein the optical dual wedge scanner has the wedge diameter smaller than 10% of a linear aperture of the telescope.

21. The telescope with internal scanner 1, wherein the optical dual wedge scanner has the wedge diameter smaller than 25% of a linear aperture of the telescope.

22. The telescope with internal scanner 1, wherein the dual wedge optical scanner has the wedge diameter smaller than 50% of a linear aperture of the telescope.

23. An imaging LIDAR/Polarimeter comprising:
a light source that can emit a beam of light;
a telescope with internal scanner comprising:
an optical wedge scanner including a first optical wedge and a controller arranged to control a synchronous rotation of the first optical wedge, the wedge being constructed and arranged to scan light over predetermined topological surfaces and/or volumetric scatterers and to deflect the light redirected by the topological surfaces and/or volumetric scatterers;
a first converging optical element that receives the redirected light and transmits the redirected light as a beam along a predetermined light path toward the scanner; and
a second converging optical element positioned within the light path between the first optical element and the wedge optical scanner, the second converging optical element being disposed to converge the redirected light toward the wedge optical scanner and to reduce an area of impact on the wedge optical scanner of the beam transmitted by the first optical element;
a detector module arranged to detect light collected by the telescope and generate signals responsive to the detected light; and
a processor constructed to process signals generated by the detector.

24. The imaging LIDAR/Polarimeter of claim 23, the optical wedge scanner further comprising a second optical wedge, wherein the light source is a pulsed laser and the controller is arranged to synchronize the rotation rates of the first and second optical wedges to the laser pulse rate.

25. The imaging LIDAR/Polarimeter of claim 24, wherein the laser is a frequency-doubled Nd:YAG laser that transmits a laser beam containing photons having substantially a wavelength of the principle Nd:YAG laser transitions and frequency-doubled photons having substantially a wavelength of one half of the wavelength of the principle Nd:YAG laser transitions.

26. The imaging LIDAR/Polarimeter of claim 24, further comprising a laser start detector arranged to detect start times of each laser pulse and provide the start times data to the controller.

27. The imaging LIDAR/Polarimeter of claim 23, wherein the optical dual wedge scanner is constructed and arranged to simultaneously scan light emitted by the light source and the light redirected by topological surfaces and/or volumetric scatterers.

28. The imaging LIDAR/Polarimeter of claim 24, further comprising a laser beam expander arranged to expand the diameter of the laser beam.

29. The imaging LIDAR/Polarimeter of claim 24, further comprising a laser beam dividing device arranged to divide the laser beam into an array of substantially equal energy beamlets.

30. The imaging LIDAR/Polarimeter of claim 29, where the laser beam dividing device is a diffractive beam dividing device.

31. The imaging LIDAR/Polarimeter of claim 29, where the laser beam dividing device is a Holographic Optical Element (HOE).

32. The imaging LIDAR/Polarimeter of claim 23, further comprising an annular mirror arranged to selectively transmit light emitted by the pulsed laser and to reflect the light collected by the telescope toward the detector module.

33. The imaging LIDAR/Polarimeter of claim 23, wherein the detector module comprises a 3D imaging leg and a polarimeter leg.

34. The imaging LIDAR/Polarimeter of claim 33, wherein the 3D imaging leg comprises a dichroic beam splitter arranged to separate components of collected light into a 3D imaging beamlets comprising the frequency-doubled photons and a polarimetry beam comprising the photons with wavelength substantially equal to the wavelength of the principle Nd:YAG laser transitions.

35. The imaging LIDAR/Polarimeter of claim 33, wherein the 3D imaging leg and the polarimeter leg comprise a spectral filters and a spatial filters constructed and arranged to reduce the noise background seen by the detectors.

36. The imaging LIDAR/Polarimeter of claim 33, wherein the 3D imaging leg further comprises a Dove prism constructed and arranged to adjust azimuthal positions of the beamlets with respect to the optical axis of the 3D imaging leg.

37. The imaging LIDAR/Polarimeter of claim 33, wherein the 3D imaging leg further comprises a multichannel photodetector, Dove prism, and a telephoto lens assembly constructed and arranged to spatially match the beamlets to individual pixels of the multichannel photodetector.

38. The imaging LIDAR/Polarimeter of claim 37, wherein the multichannel photodetector is chosen from the set of multichannel photodetectors consisting of photodiodes and photodiode arrays, PIN diodes and PIN diode arrays, phototransistors and phototransistor arrays, CCD and CMOS photodetector arrays.

39. The imaging LIDAR/Polarimeter of claim 37, wherein the multichannel photodetector is a multi-anode photomultiplier.

40. The imaging LIDAR/Polarimeter of claim 37, wherein the multichannel photodetector is a microchannel plate photomultiplier.

41. The imaging LIDAR/Polarimeter of claim 33, wherein the polarimeter leg further comprises a polarizer and at least two photodetectors constructed and arranged to detect the depolarization of the photons having the wavelength substantially equal to the wavelength of the principal Nd:YAG laser transition.

42. The imaging LIDAR/Polarimeter of claim 23 further comprising a transmitter optical dual wedge scanner comprising a first optical wedge, a second optical wedge.

43. The imaging LIDAR/Polarimeter of claim 42 where the telescope with internal scanner is arranged and positioned such that any optical component of the telescope does not intersect or focus the transmitter laser beam.

44. The imaging LIDAR/Polarimeter of claim 42 where the telescope with internal scanner is arranged such that backscatter of the transmitter laser beam light into the detector module is substantially eliminated.

45. The imaging LIDAR/Polarimeter of claim 42 wherein the controller is arranged to synchronize the rotation of the first and second optical wedges of the optical dual wedge scanner and the transmitter optical dual wedge scanner to a laser pulse rate.

46. The imaging LIDAR/Polarimeter of claim 42 further comprising a transmitter beam expander constructed and arranged to expend the diameter of a laser beam impacting the transmitter optical dual wedge scanner.

* * * * *